United States Patent [19]

Gnirss et al.

[11] Patent Number: 5,627,955

[45] Date of Patent: May 6, 1997

[54] METHOD AND APPARATUS FOR GENERATING A HARDWARE CONFIGURATION DISPLAY

[75] Inventors: Manfred Gnirss, Boeblingen; Walter Schuppen, Sindenfingen; Berthold Reddemann, Esslingen, all of Germany

[73] Assignee: International Business Machines Corporation, Armonk, N.Y.

[21] Appl. No.: 412,809

[22] Filed: Mar. 29, 1995

[30] Foreign Application Priority Data

Mar. 31, 1994 [EP] European Pat. Off. ............... 94105160

[51] Int. Cl.⁶ ..................................... G06F 15/00
[52] U.S. Cl. ..................................... 395/141
[58] Field of Search ............... 395/153–5, 162, 395/141; 364/491

[56] References Cited

U.S. PATENT DOCUMENTS 4,195,344  3/1980  Yamazaki ................................. 364/120
5,038,294  8/1991  Arakawa et al. ....................... 364/491
5,390,138  2/1995  Milne et al. ............................. 381/116

OTHER PUBLICATIONS

Research Disclosure, Aug. 1988, No. 292, Kenneth Mason Publications Ltd. England, entitled "Automated WYSIWYG Presentation of Hardware" by R.J. Torres.

*Primary Examiner*—Heather R. Herndon
*Assistant Examiner*—Rudolph Buchel
*Attorney, Agent, or Firm*—William A. Kinnaman, Jr.

[57] ABSTRACT

A method and apparatus for producing a display of the hardware configuration of a data processing system comprising at least one processor and at least one device attached to the processor. The processor has a configuration table for defining the logical connections between the device and the processor and the system having a display device for displaying the configuration of the system. Within the processor, a configuration display memory space is created for constructing a display of the logical connections between the processor and the at least one device. The display device is able to access the configuration display memory space and display the contents of the configuration display memory space in a visually comprehensible form.

19 Claims, 12 Drawing Sheets

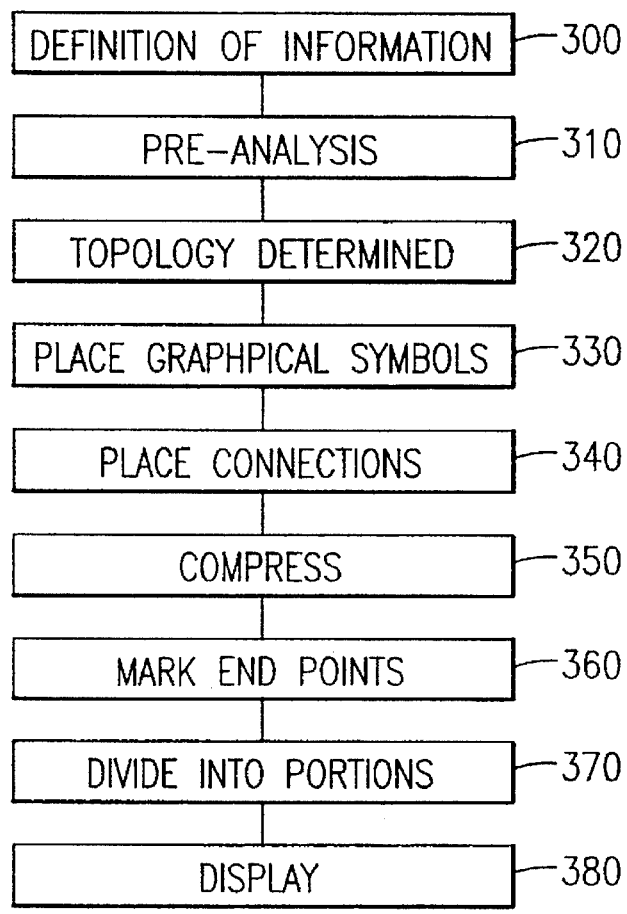
FIG.5
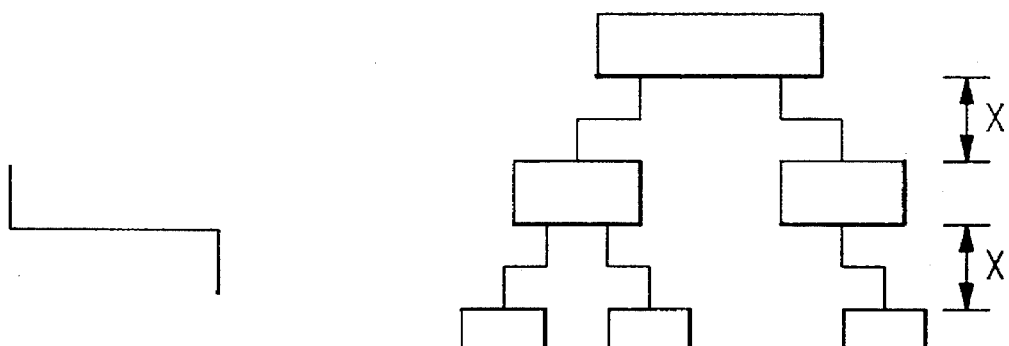
FIG.7
FIG.8

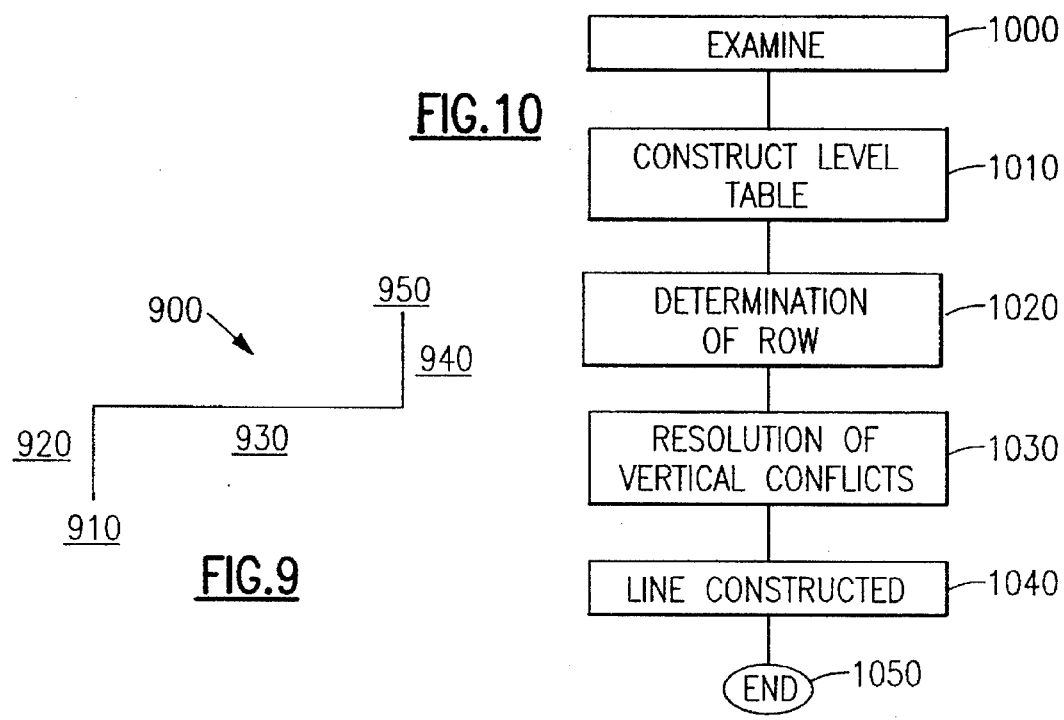
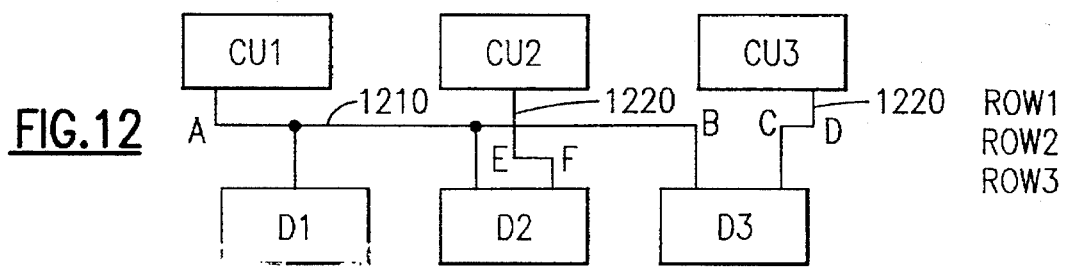

| LEFT | RIGHT | TOP | BOTTOM | RESULT |
|------|-------|-----|--------|--------|
| —    |       |     | \|     | ┐      |
| —    |       | \|  |        | ┘      |
|      | —     |     |        | ┌      |
| ⋮ | | | | |
| ┬    |       |     | \|     | ┐      |
| —    | —     | \|  | \|     | +      |

NEIGHBOURS OF ?

| LEFT | RIGHT | TOP | BOTTOM |
|------|-------|-----|--------|
| —    |       | \|  |        |

RESULTS IN

FIG. 18

METHOD AND APPARATUS FOR GENERATING A HARDWARE CONFIGURATION DISPLAY

BACKGROUND OF THE INVENTION

1. Field of the Invention

The invention relates to a system comprising at least one processor and at least one device attached to the processor, the processor having a configuration table for defining the logical connections between the at least one device and the processor, the system having a display device for displaying the configuration of the system.

2. Description of the Related Art

The System Hardware Management (SHAMAN) from New Era Software offers one solution to the problem of producing and displaying hardware configuration diagrams for mainframe machines. Shaman downloads from the mainframe the data files necessary to construct the diagrams into the memory of a personal computer and then produces on the screen of the personal computer or on an attached printer the configuration diagrams.

Since the configuration displays are produced on the personal computer side of a data processing system, it is not possible to monitor dynamic changes of the hardware configuration. Additionally, Shaman is restricted to showing the hardware configuration of the peripherals connected to a single processor whereas modern computer systems consist of a plurality of computers, peripherals and devices connected together in a network.

The Graphic Configuration Manager produced by The Graphic Management Group, Inc., offers similar facilities to Shaman and has the same disadvantages.

*Research Disclosure* no. 292, dated August 1988 and entitled "Automated WYSIWYG Presentation of Hardware", describes briefly the advantages of graphically displaying computer system hardware but offers no detailed solution to the problem.

Known from U.S. Pat. No. 4,195,344 (Yamazaki) is a system in which the configuration of a plurality of information processing modules may be automatically monitored and supervised. The patent described here, however, does not teach a method or apparatus for displaying the information obtained from the monitoring and supervision of the information processing modules.

SUMMARY OF THE INVENTION

An object of the invention is therefore to produce an apparatus and method which allows the user to produce complex graphical displays of the hardware configuration of a computing environment.

This object is solved by the processor additionally comprising in operation a configuration display memory space for constructing a display of the logical connections between the processor and the at least one device, wherein the display device in operation outputs the contents of the configuration display memory space.

Since the processor is provided with a configuration display memory space for constructing the configuration display, it is not necessary for the required data to be downloaded to a personal computer. This saves the need of providing a personal computer connected to the data processing system. It furthermore saves the time needed for the construction of the display since the data does not need to be loaded from the mainframe processor to the processor of a personal computer.

In a further embodiment of the invention, the system possesses a plurality of processors and a first configuration table for defining the logical connections between the plurality of processors wherein the first configuration table is usable for constructing the display of the logical connections within the configuration display memory space. The use of this first configuration table to construct the configuration display diagram means that the invention is able to construct more detailed diagrams than those possible with the prior art systems.

The system also includes a plurality of second configuration tables which define the logical connections between one of the plurality of processors and the at least one device. The use of the plurality of second configuration tables distinct from the first configuration tables allows the system programmer to program several different configurations for the devices connected to the channel subsystem of the processor. These can be changed whenever necessary to ensure efficient operation of the system.

According to one embodiment of the invention, the system consists of a plurality of devices connected to the channel subsystems of the processors. The logical connections between the plurality of devices and the processor are defined in the first and/or second configuration tables. Control units are connected between the processors and the devices. The logical connections between the control units, the devices and the processors are defined in the first and/or second configuration tables.

The first or second configuration tables have a similar structure and include a list of logical connections between the processor and the device, a pointer to the list of processors, a pointer to the list of devices.

The contents of the configuration display memory space can be output in the form of a dataset, on a display device or on a printer.

The object of the invention is furthermore solved by a method for displaying the configuration of a data processing system on a display device comprising the following steps:

(1) defining the displayable information;

(2) creating a configuration display memory space in the virtual memory of the processor;

(3) reading configuration data relating to the logical connections between the entities from a configuration table stored in the processor;

(4) determining the topology of the entities;

(5) placing in the configuration display memory space entries to represent the common entities;

(6) extracting connection data between the common entities from the read configuration data;

(7) creating in the configuration display memory space connections between the entities using the extracted connection data; and (8) outputting on an output device the configuration of the data processing system using the configuration display memory space.

In the method the fifth step comprises placing all the members of the same group of common entities in the same region of the configuration display memory space. This allows the person looking at the configuration display to easily distinguish the various types of entities or objects being displayed.

The method can further comprise a step of optimising the layout of the entities and connections within the configuration display memory space. By optimising the layout, one can obtain concise diagrams which are easily understandable to the viewer.

In a particularly advantageous embodiment of the method, a procedure is carried out to determine the crossings of connections and placing a particular symbol at the position of the connection crossings. Experience has shown that this symbol should consist of a '-'. This improves the readability of the configuration diagram.

Furthermore, a step of determining the coincidences of lines representing vertical and horizontal connections can be carried out and the coincidences eliminated. This also improves the readability of the diagram.

DESCRIPTION OF THE DRAWINGS

FIG. 5 shows a flow diagram illustrating the steps involved in building the configuration diagram.

FIG. 7 shows a dogleg used in connecting the graphical objects of the configuration diagram.

FIG. 8 shows a typical example of a configuration diagram with doglegs.

FIG. 9 shows a dogleg with endpoints.

FIG. 10 shows a flow diagram for the line crossing algorithm.

FIG. 11 shows a level table.

FIG. 12 shows rows of a configuration diagram.

FIG. 16 shows a pattern table for the near neighbour determination.

FIG. 17 shows a more complicated definition of a character based on neighbour determination.

FIG. 18 shows the result of replacing a character by another character determined according to neighbour determination.

DETAILED DESCRIPTION OF THE INVENTION

Figure 1:
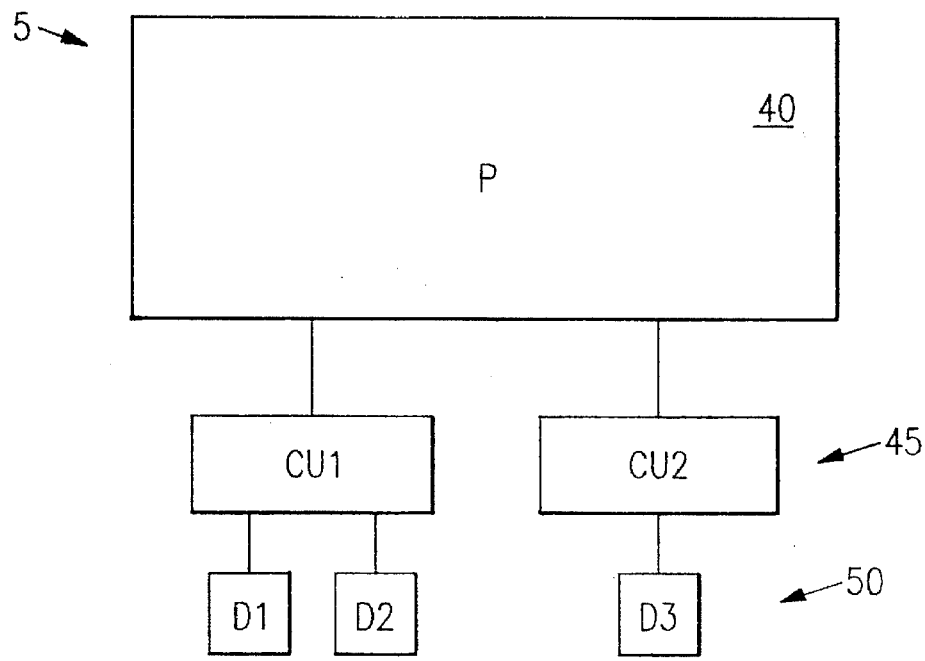
FIG. 1 shows a simple overview of a channel-based data processing system.

FIG. 1 shows an overview of a channel-based data processing system 5. Such data processing systems are typical of the IBM System/390 (S/390) and compatible computer architectures. (IBM, System/390 and S/390 are registered trademarks of IBM corporation.) They comprise one or more processors 40 (P) to which are attached control units 45 (CU1, CU2). Devices 50 (D1, D2 and D3) are attached to the control units 45 (CU1, CU2). The devices 50 can be tape drives, direct access storage devices (DASD), terminals, etc. FIG. 1 shows only one processor P, two control units CU1, CU2 and three devices D1, D2, D3 for simplicity. In practice, there will be many more processors, control units and devices. The control units CU1, CU2 and devices D1, D2, D3 form the channel subsystems of the processor P.

Figure 2B:
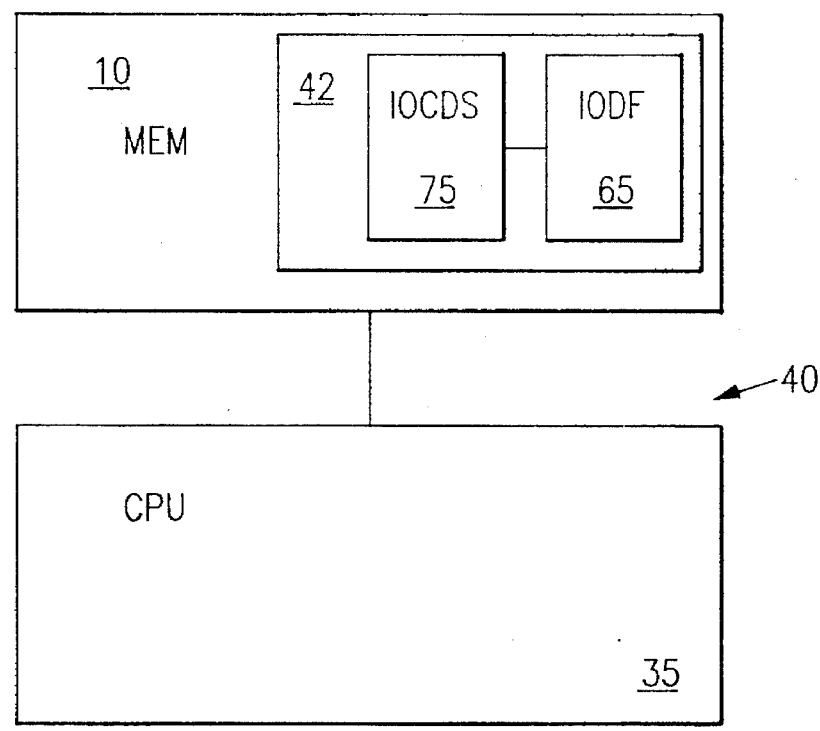
FIG. 2B shows the structure of the processor of the data processing system.
Figure 2A:
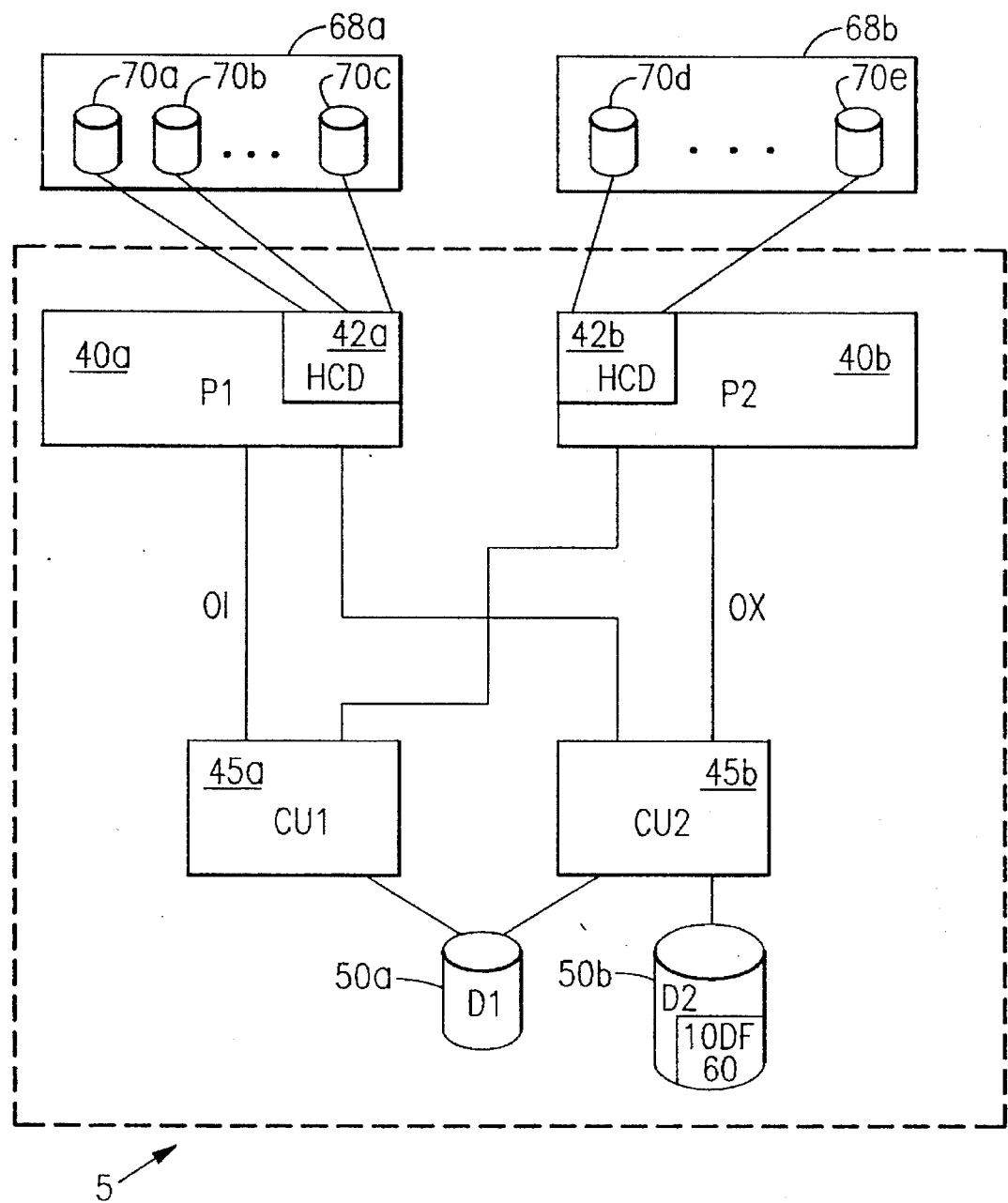
FIG. 2A shows an overview of another channel-based data processing system.

FIG. 2A shows a more complicated structure of a channel-based data processing system 5. The data processing system 5 comprises two processors 40a, 40b, two control units 45a, 45b and two devices 50a, 50b. Both of the processors 40 are connected to both of the control units 45. The first device 50a is connected to both of the control units 45. The second device 50b is only connected to the second one 45b of the control units. Also shown on FIG. 2A are direct access storage devices (DASD) 68a, 68b which are accessible by the processors 40, and in particular by a Hardware Configuration Definition (HCD) module 42 within the processors 40. (Hardware Configuration Definition is a trademark of IBM Corporation.) The DASDs 68 have a plurality of datasets 70a–e, termed the input/output configuration datasets (IOCDS) 70, stored on them. The function of the IOCDS datasets 70 and the HCD module 42 will be explained later.

The structure of the processors 40 in one example of the invention is shown in FIG. 2B. The processor 40 comprises a memory 10 and a central processing unit (CPU) 35. For the purposes of explanation, it will be assumed that on the processor 40 is running the MVS/ESA operating system, a proprietary operating system developed by the IBM Corporation for the System/390 architecture. (MVS/ESA is a trademark of IBM corporation.) However, the invention could operate equally well in other operating systems.

The MVS/ESA operating system includes the HCD module 42 shown in FIGS. 2A and 2B and termed the Hardware Configuration Definition (HCD) module which allows a system programmer to define and configure the hardware and the topology of the data processing system 5. The HCD module 42 constructs and accesses two datasets, an input/output definition file (IODF) 60 and the IOCDS dataset 70 whose function will be explained later. Within the HCD module 42 are shown two blocks, the IODF block 65 and the IOCDS data block 75, whose function will also be explained later.

The IODF 60 contains details of all of the processors 40, control units 45 and devices 50 which form the data processing system 5. The IODF 60 may further contain details of any switches or configuration managers (such as the IBM ESCON Manager) within the data processing system 5. (ESCON is a registered trademark of IBM Corporation.) The structure of the data within the IODF 60 will be explained later. The IODF 60 is constructed by the HCD module 42 running in one of the processors 40 and is defined by the system programmer.

The IOCDS datasets 70 contain details of the configuration and topology of the hardware connected to a single one of the processors 40. So, for example, the IOCDS dataset 70a as shown in FIG. 2A would contain details of the connections between the first processor 40a, control units 45a and 45b and the devices 50a and 50b. The IOCDS dataset 70a would not contain the details of the connections of the control units 45a and 45b to the second processor 40b. The connections to the second processor 40b are found within one of the IOCDS datasets 70d, 70e accessible to the second processor 40b. The IOCDS datasets 70 will also include details of any switches, etc. to which the processor 40 is connected. The structure of the data within the IOCDS datasets 70 is explained later.

The IOCDS datasets 70 are used at power-on-reset time in order to construct the channel control blocks by means of which the processor 40 can access the control units 45 and thus the devices 50.

More than one IOCDS dataset 70 can be associated with each processor 40. For example, the first processor 40a in FIG. 2A has three IOCDS datasets 70a–c associated with it and the second processor has two IOCDS datasets 70d, 70e associated with it. Further IOCDS datasets 70 may be present. The plurality of IOCDS datasets 70 allows the system programmer to change the configuration and the topology of the data processing system 5 according to the data processing needs of the users.

The devices, control units, switches, configuration managers etc. can be collectively termed entities. Every time a new one of these entities is to be added to the data processing system 5, the input/output definition file (IODF) 60 has to be amended. The system programmer does this by starting the HCD modules 42 in one of the processors 40 and copying the IODF 60 from the device 50 into the memory 10 of the processor as is shown by IODF block 65 in FIG. 2B. The system programmer carries out the necessary modifications to the IODF 65 within the memory 10 to define the configuration and topology of the newly added entities to the data processing system 5. The IODF block 60 within the memory is then written back to the IODF dataset 60 stored on the device 50b where it replaces the former IODF dataset 60.

The newly added entity is now defined to the IODF dataset 60. However, until it is defined to at least one of the processors 40, it cannot be accessed by any of the processors 40. Definition of the newly added object to the processors 40 is carried out by creating a new IOCDS dataset 70 or amending an existing IOCDS dataset 70. This is done by the system programmer starting the HCD modules 42 within the processor 40 to which the newly added object is to be defined.

The updated IODF dataset 60 is copied into the memory 10 as represented by the IODF block 65 in FIG. 2B. A new IOCDS dataset (represented by block 75) is then created within the memory 10 by extracting the required data from the IODF block 65. The new IOCDS dataset 70 can then be written onto the DASD 68.

Having updated the IODF dataset 60 and created the new or amended IOCDS dataset 70, the system programmer may remove the HCD modules 42 from memory 10 as they are no longer needed. The newly added object is accessible to the data processing system 5 when the IOCDS 70 in which it is described is next used by one of the processors 40 to define the configuration and topology of the hardware.

Figure 3:
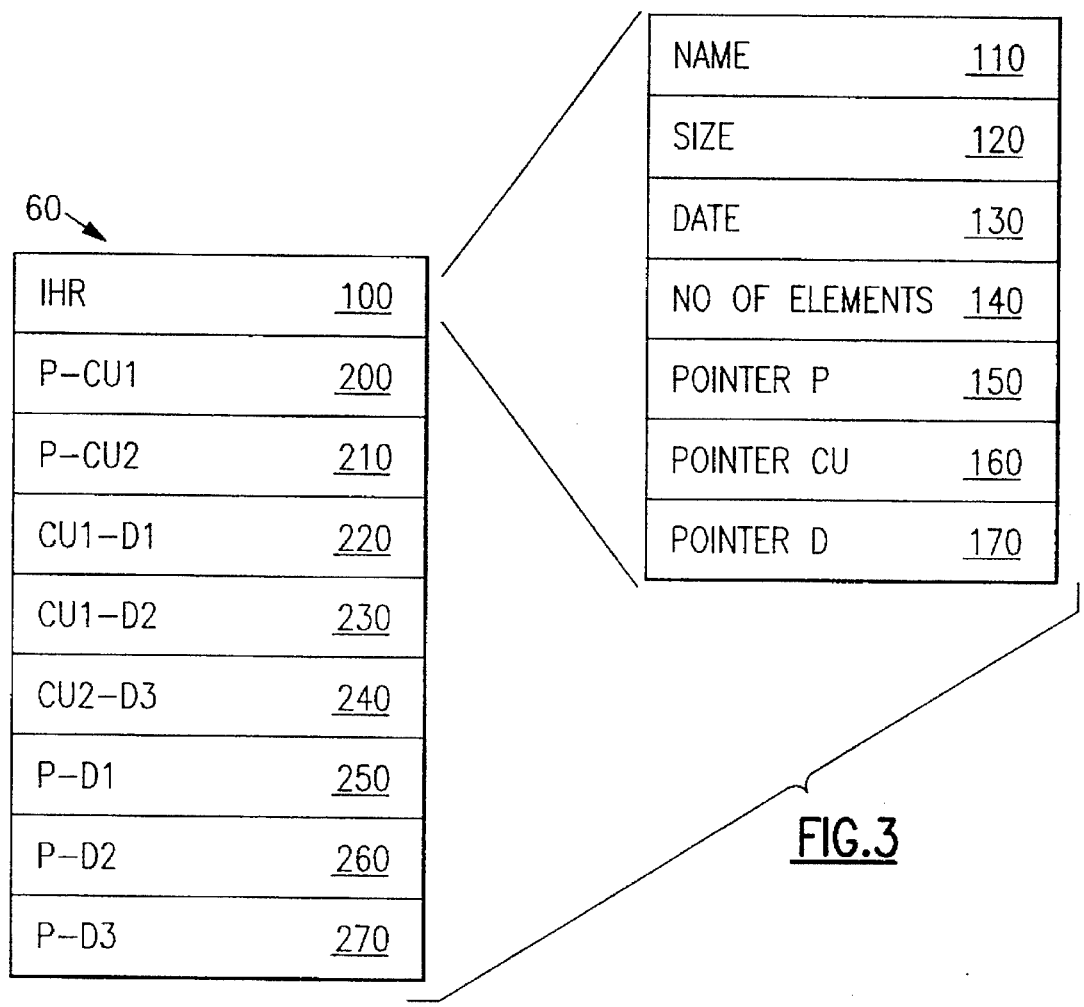
FIG. 3 shows the structure of the input/output definition file.

FIG. 3 shows the structure of the IODF 60. The input/output definition file 60 comprises an IODF header record (IHR) 100 and a list of elements 200–270. The IHR 100 contains the name 110 of the IODF 60, the size of the IODF 120, the date of construction 130 of the IODF 60, the number of elements 140 in the IODF 60, a pointer 150 to the list of processors P in the data processing system 5, a pointer 160 to the list of control units CU1, CU2 in the data processing system 5 and a pointer 170 to the list of devices D1, D2, D3 in the data processing system 5. The IODF 60 will additionally contain pointers to other objects which may be contained within the data processing system 5.

The list of elements 200–270 in the IODF 20 shows all the possible connections between the processors P, control units CU1, CU2 and devices D1, D2 and D3 within the data processing system. Illustrated in FIG. 3 is a sample IODF 60 for the data processing system 5 shown in FIG. 1.

The descriptions 250–270 of the possible connections between the processors 40 and devices 50 are known as device attachment records (DAR). The DARs include the unit address, the time out value and details of the preferred path between the devices D and the processor P. The descriptions between the processors P and the control units CU are known as the control unit attachment records (CAR).

The IODF 60 comprises a list of processors P pointed to by the pointer P 150. The list of processors P is maintained as an AVL tree. Each element in the AVL tree has a record which indicates the name and type of processor P as well as other information related to the processor P. The IODF 60 comprises a list of control units CU1, CU2 pointed to by the pointer CU 160. The list of control units CU1, CU2 is maintained as an AVL tree. Each element within the AVL tree contains information relating to the control units CU1, CU2. Finally the IODF 60 comprises a list of devices D1, D2, D3 pointed to by the pointer D 170. The list of devices D1, D2, D3 is also maintained as an AVL tree. Each element within the device AVL tree has a record which indicates the type of device (DASD, tape unit, terminal, etc.) and to which control unit it is attached. The elements within the AVL trees may include further information as required.

Figure 4:
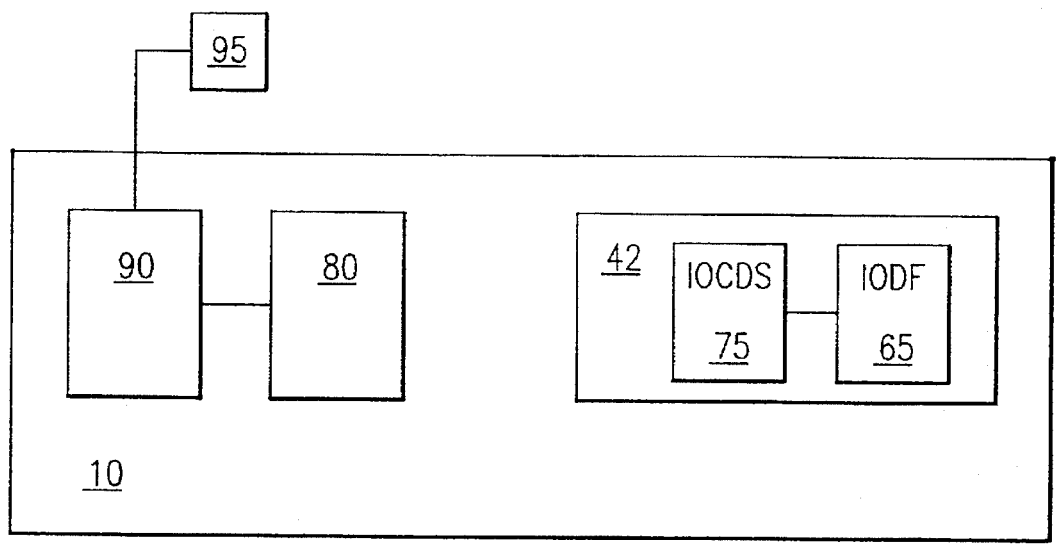
FIG. 4 shows the structure of the memory space used for building the configuration diagram.

In order to display the configuration of the data processing system, the data present in the IODF 60 may be used to construct a configuration diagram for display on a terminal or for printing on a printer. The method by which this is carried out will be explained by reference to the memory space structure shown in FIG. 4 and the flow diagram of FIG. 5. FIG. 4 is very similar in detail to FIG. 2 and the same reference signs are used on both figures to illustrate the same elements. FIG. 4 additionally includes processing tables 80 and a configuration display memory space 90, the function of which will be explained in more detail subsequently. Connected to the configuration display memory space 90 is a display device 95 which may be a printer or a terminal. Alternatively, data generated can be written into a dataset for later use. Collectively the datasets, printers and terminals may be termed output devices.

The flow diagram of FIG. 5 illustrates the steps that are necessary in order to display the configuration of the data processing system 5. In step 300, the system programmer or other user selects the information that he or she wishes to display. For example, the system operator may chose to only display information about one processor P or only devices D of a certain type and the processors P to which they are connected. Collectively, the processors P, devices D and control units CU which are to be displayed are known as display objects. The possibilities of selection of display objects are limited only by the information stored in the elements of the AVL trees of the processors P, control units CU and devices D.

The invention as implemented currently provides for four types of configuration displays or reports to be produced and which may be selected by the system programmer. Other report formats are possible.

| | |
|---|---|
| CU | This produces a report which shows all the devices connected to the control units CU and the processors P which are able to address the control units CU. |
| CHPID | This produces a report which shows |

| | |
|---|---|
| | channels and all of the control units CU and devices D which are connected to the channels. |
| SWITCH | This produces a report which shows the selected switches S and the control units CU, devices D and processors P which are connected to the switches. |
| LCU | This produces a report which is essentially a combination of the CU and CHPID reports. |

In step 310 a pre-analysis of the data for display is carried out and the processing tables 80 within the memory 10 are constructed. The pre-analysis of the data involves selecting those display objects from the AVL trees of the IODF 60 of the processors P, control units CU and devices D which match the search criteria selected by the system operator in step 310. Information about the selected display objects are placed in the processing tables 80 as well as any other information which is to be displayed on the configuration display. For example, the model numbers of the devices D may be obtained from the elements in the device AVL tree and stored in the processing tables 80.

The topology of the configuration to be displayed is determined in step 320. The topological information is obtained from an analysis of the elements 200–270 in the IODF 60. Each of the DARs and CARs 200–270 is examined to see whether it represents a connection between the selected display objects stored in the processing tables 80 and, if this is so, the topological information is copied into a further processing table 80.

In step 330, the drawing of the configuration diagram is begun. Each of the display objects in the processing tables 80 are grouped together in their respective types, for example a group of processor display objects representing all of the processors P which are to be displayed, a group of control unit display objects representing all of the control units CU which are to be displayed and a group of device display objects representing all of the devices D to be displayed.

Figure 6A:
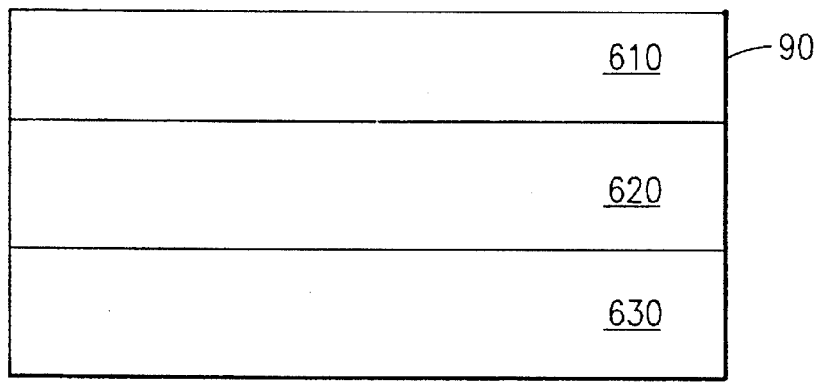
FIG. 6 shows the various stages of constructing a typical example of a configuration diagram.

In the memory 10, the configuration display memory space 90 is constructed and graphical symbols representing each of the display objects are placed within the configuration display memory space 90. The configuration display memory space 90 is then logically divided into blocks 610, 620, 630 as shown in FIG. 6A. Each of the blocks will later contain all of the members of one group of the display objects.

Figure 6B:
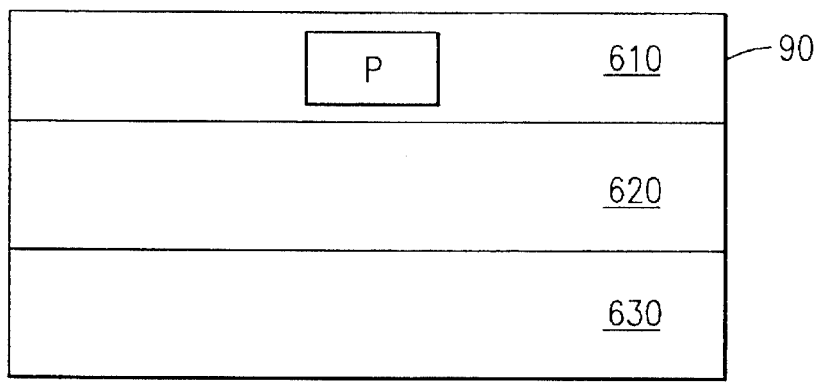

In the preferred embodiment of the invention, the topmost block 610 contains the members of the group of the processor display objects. Graphical symbols representing each of the processor display objects are then placed within the topmost block 610. In the explanatory embodiment of the invention, i.e. the data processing system 5 shown in FIG. 1, only one processor 40, P is to be displayed and hence a single graphical symbol representing the processor is placed in the topmost block 610 as shown in FIG. 6B. The graphical symbol is placed in the middle of the topmost block 610.

Figure 6C:
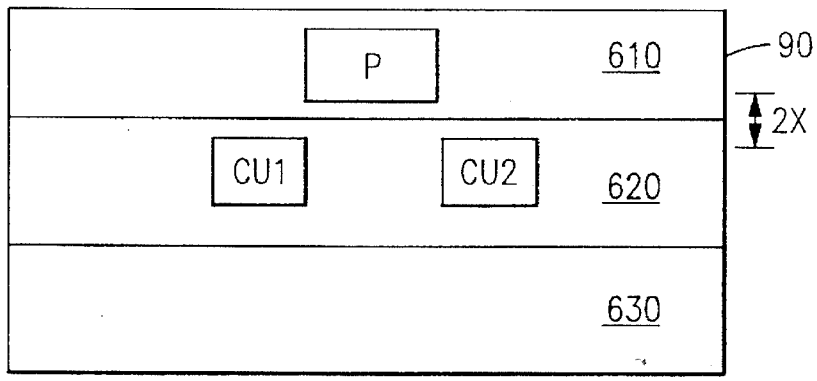

In the explanatory embodiment of the invention, the middle block 620 contains the members of the group of the control unit display objects 50. Graphical symbols representing each of the control unit display objects are then placed within the middle block 620. In the data processing system 5 of FIG. 1, two control units are to be displayed and hence two graphical symbols representing the control units 45, CU1, CU2 are placed in the middle block 620 as shown in FIG. 6C. The graphical symbols representing the control units are placed at the same level within the middle block 620 and distributed equally on the horizontal level.

The amount of vertical space left between the graphical symbols representing the control units and the processor graphical symbol depends on the maximum possible number of connections between the control units CU and the processor P in the data processing system 5. In the explanatory embodiment of the invention, only two connections are possible, i.e. one from each control unit CU to the processor P. Thus a space sufficient to show the two connections is left. This distance will be termed 2X and is shown on FIG. 6C.

Figure 6D:
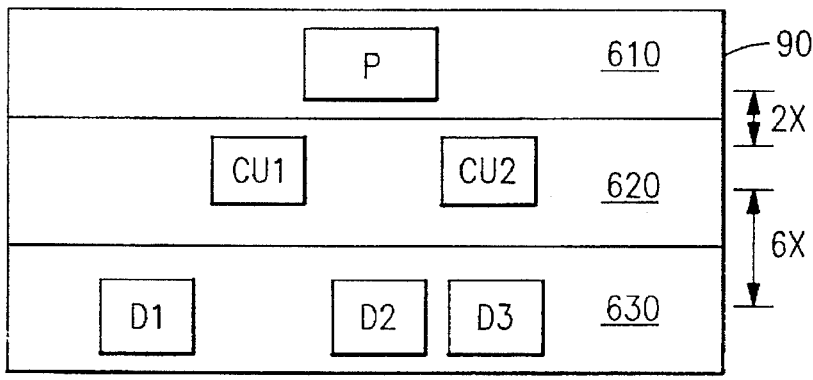

In the explanatory embodiment of the invention, the bottommost block 630 contains the members of the group of the device display objects. Graphical symbols representing each of the device display objects are then placed within the bottommost block 630. In the data processing system 5 shown in FIG. 1 three devices D are to be displayed and hence three graphical symbols representing the devices D are placed in the bottommost block 630 as shown in FIG. 6D. The graphical symbols representing the devices D are placed at the same level within the bottommost block 630. An attempt is made to place the graphical symbols representing the devices D directly underneath the control units 45 to which the devices D are attached.

The amount of vertical space left between the graphical symbols representing the control units CU and the device graphical symbols depends on the maximum possible number of connections between the control units CU and the devices D the data processing system 5. In the explanatory embodiment of the invention, a maximum of six connections are possible, i.e. one from each control unit CU to each of the three devices D. Thus a space sufficient to show the six connections is left between the groups of graphical symbols. This distance will be termed 6X and is shown on FIG. 6C.

It is obvious that because there are three times more connection possible between the control units 45 and the devices 50 than between the processor 40 and the control units 45, then the vertical space left between the group of graphical symbols representing the control units 45 and the group of graphical symbols representing the devices 50 is three times greater than the vertical space between the group of graphical symbols representing the control units CU and the graphical symbol representing the processor P.

It should be emphasised that, at this stage, no configuration display has been produced at a terminal or on a printer. Rather the configuration display is being constructed logically within the configuration display memory space 90.

In step 340, the connections between the graphical symbols are placed in the configuration display memory space 90. The details of the connections were extracted from the elements of the IODF 65 during the pre-analysis of the IODF 65 in step 310. To display the connections, so-called "dogleg" connection symbols, as shown in FIG. 7, are used which run from either the bottom of one graphical symbol to the top of another graphical symbol in a lower one of the blocks 610–630. The dogleg connection symbols are used in the preferred embodiment of the invention since they have been shown to be the most readable means of illustrating the connections between the graphical display symbols. However, other connection symbols could equally well be used.

Having placed the doglegs as the connection symbols, the display configuration of the data processing system 5 of FIG. 1 will have the form shown in FIG. 8. At this stage, a line crossing algorithm is employed to improve the readability of connection lines which cross one another. For the simple example of the data processing system 5 of FIG. 1, there are no crossing lines and hence the algorithm does not need to be employed. The algorithm will be explained in more detail later.

The configuration display may now be compressed as shown in step 350. It will be recalled that sufficient room was left between the graphical symbols representing the device display objects and the control unit display objects to display six connections. However, only room for one connection needs to be used (there being no overlapping connections in this example). Thus the graphical symbols representing the two types of display objects can be moved closer together without loss of clarity in the configuration diagram.

Similarly, place for two connections was left between the graphical symbol representing the processor display object and the graphical symbols representing the control unit display objects. The graphical symbols can also be moved closer together to make optimal use of the configuration diagram. This is shown in FIG. 8 in which the vertical space left between the graphical symbol representing the processor P and the group of graphical symbols representing the control units CU is now the same as that between the group of graphical symbols representing the control units CU and the group of graphical symbols representing the devices D.

Step 360 shows an optional feature to improve the clarity of the configuration diagrams. Each connection can be marked with a name or number and the end points of the connections can be marked on the graphical symbols with the name or number. This allows the quick identification of the connections between the display objects.

In step 370, the configuration diagram generated in the configuration display memory space 90 is divided into portions where the size of each portion is such to allow it to be displayed on the available display device 95 or printed on the available printer. So-called off-page connectors are provided at the edges of the portions to indicate the connections between the different portions. These will be explained in more detail later.

Finally in step 380, the generated configuration display is extracted from the configuration display memory space 90 and displayed on the display device 95. There are many methods known in the prior art for producing a display or printing, for example, the pixels from the configuration display memory space 90 can be mapped directly to the terminal screen or printer. Alternatively, vectors representing the lines in the configuration display memory space 90 can be constructed and these used to generate the display or printout.

The line crossing algorithm mentioned above will now be described. The structure of the dogleg as shown in FIG. 7 will first be described to allow for a better understanding of the invention. FIG. 9 shows a dogleg 900 similar to the one of FIG. 7. The dogleg 900 has a first endpoint 910 and a second endpoint 950. In the preferred embodiment of the invention, the drawing of the dogleg 900 is divided into three steps. In the first step, a first vertical line 920 is drawn. In a second step, a horizontal line 930 is drawn and in a third step a second vertical line 940 is drawn.

FIG. 10 is a flow diagram for the line crossing algorithm according to the present invention. In a first step 1000, the configuration display constructed in the configuration display memory space 90 is examined and, in step 1010, so-called level tables 1100 are constructed. A typical example of a level table 1100 is shown in FIG. 11. The level tables 1100 are part of the processing tables 80 mentioned earlier. The level table 1100 contains, among other data, the name of the display object 1110 from which the dogleg 900 emerges, the left most X coordinate 1120 of the horizontal line 930 and the rightmost X coordinated 1130 of the horizontal line 930. The level table 1100 furthermore contains the row 1140 in which the horizontal line 930 appears. The row is essentially the Y co-ordinate of the horizontal line 930.

A comparison of the level table 1100 with the configuration display of FIG. 12 will aid in understanding these concepts. From FIG. 12, it can be seen that the dogleg 1210 emerging from the control unit CU1 has as its leftmost X coordinate the letter A and as its rightmost X coordinate the letter B. The dogleg 1220 emerging from the control unit CU2 has as its leftmost X coordinate the letter E and as its rightmost X coordinate the letter F. The dogleg 1230 emerging from the control unit CU2 has as its leftmost X coordinate the letter C and as its rightmost X coordinate the letter D. This data is found in the columns 1120 and 1230 of the level table 1100.

The horizontal line 930 of each dogleg 1210, 1220, 1230 can be placed in one of the rows 1, 2 or 3 as shown on FIG. 12. An attempt is made to optimise in step 1020 the filling of the rows without any overlapping horizontal lines 930. As is immediately clear from FIG. 12, this has been successfully achieved with the doglegs 1210 and 1230 which have both been placed in row 1 without overlap. It would not have been possible to place the horizontal line 930 of the dogleg 1220 in row 1 since this would have overlapped with the horizontal line 930 of the dogleg 1210. It has therefore been placed in row 2. The number of the row in which the horizontal line 930 of the dogleg is placed appears in the row column 1140 of the level table 1100.

The step 1020 of optimising the filling of the rows is carried out by stepping through each entry in turn of the level table 1100 and checking the leftmost X coordinate 1120 and rightmost X coordinate 1130 to check whether a conflict due to overlapping with another horizontal line 930 exists. If the horizontal line 930 can be placed in none of the already used rows, then it is placed in the next available row. The rows are filled in a topdown manner as shown in FIG. 12.

Figure 13:
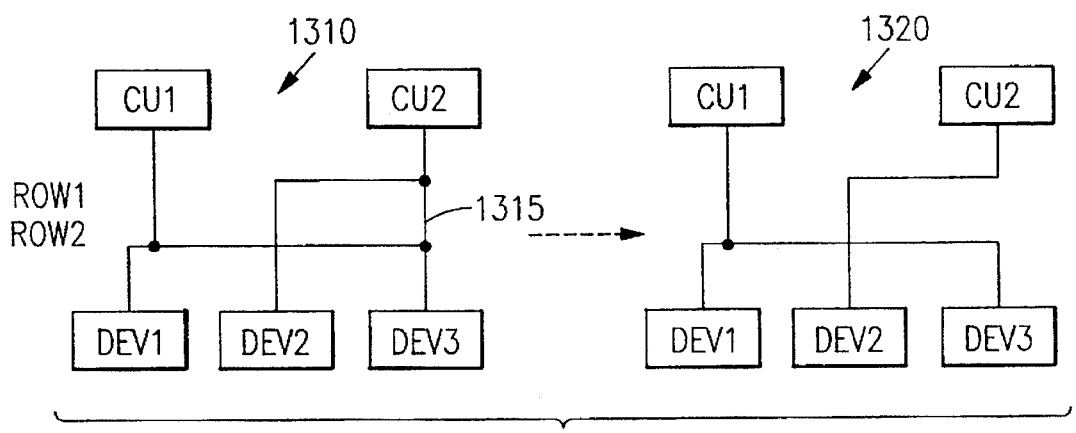
FIG. 13 shows the resolution of conflicts between vertical lines on a configuration diagram.

After assigning the horizontal lines 930 to rows in the configuration diagram, a check is made to see whether there are any conflicts with the vertical lines 920, 940. FIG. 13 illustrates such a conflict. The configuration display 1310 has overlapping vertical lines at 1315. This conflict is resolved by permuting the row numbers for the horizontal lines 930 within the level table 1100. So, for example, the horizontal lines 930 in row 1 are transferred to row 2, the horizontal lines 930 in row 2 will be transferred to row 3, etc. In general, the horizontal lines 930 in row (n−1) will be transferred to row n whilst the horizontal lines 930 in row n will be transferred to row 1, where n is the maximum number of rows. In the diagram of FIG. 13, there are only two lines (i.e. n=2). By swapping the horizontal lines 930 between the two rows, the vertical conflict at 1315 is resolved as will be seen by reference to the configuration display 1320.

After resolution of conflicts between the vertical lines 920, 940 and the horizontal lines 930, the lines between the display objects can be constructed (step 1040). The line drawing method described here is based on a character graphic method. It is at least conceivable that other methods can be implemented by the person skilled in the art.

The drawing of the lines is carried out by reference to the level table 1100 in which the left most X coordinate 1120 and the rightmost X coordinate 1130 as well as row 1140 are stored. The first element in the level table 1100 is used as a basis for the first dogleg 1210 to be constructed in the configuration display. Clearly, since there are no other doglegs initially present in the configuration display, there is no potential line crossings which need to be resolved. However, once several doglegs are depicted on the configuration display, then the crossing of some of the vertical lines 920, 940 and some of the horizontal lines 930 will be unavoidable. This must be determined so as to improve the readability of the configuration display.

Figure 14:
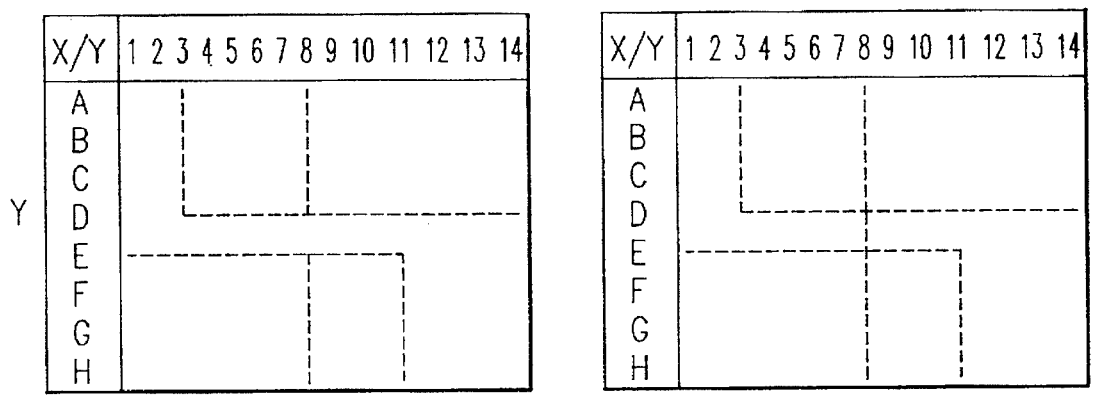
FIG. 14 shows the replacement of characters at the intersection of vertical and horizontal lines.

The basic line drawing algorithm uses the character '-' to for the horizontal line 930 of the dogleg and the character '|' for the vertical lines 920, 940 of the dogleg. When constructing the configuration display, the horizontal line 930 of the dogleg will be first constructed. Then the vertical lines 920, 940 will be constructed. This is carried out by inserting in every position in the configuration display occupied by one of the vertical lines 920, 940, the vertical line character '|'. The vertical line character '|' replaces any horizontal line character '-' which may have previously occupied the position. This is clearly illustrated in FIG. 14 in which the existing horizontal line characters '-' at 8D and 8F are replaced by the vertical line characters '|'.

Figure 15:
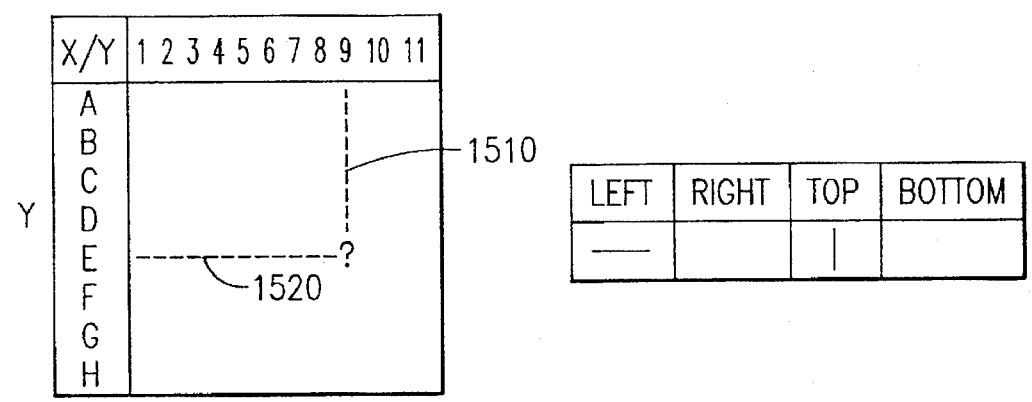
FIG. 15 shows the definition of a character based on neighbour determination.

The end points of the vertical lines 920, 940 have to been given special consideration since it is possible that the vertical lines 920, 940 may connect to other, horizontal lines. This is done by investigating the neighbours of the character to be drawn. For example in FIG. 15, the bottom of the vertical line 1510 intersects with the horizontal line 1520 at the point given by the coordinates 9E. The neighbours of the point 9E are investigated, i.e. the characters at the points 9D, 9F, 8E and 10E and the appropriate character selected, termed the connection character. FIG. 16 gives the pattern table 1600 for the connection character. The pattern table 1600 is part of the HCD module 42.

Finally, it should be noted that sometimes the neighbours of the coordinate to be investigated are not necessarily in directly adjacent coordinates as is illustrated in FIG. 17. The left neighbour of the coordinate 9E is, because of the adjacent lines, 6E. This needs to be taken into account when generating the connection character.

In a similar manner in which the connection characters for vertical lines 920, 940 are determined, it is also necessary to determine connection characters for horizontal lines 930. This is carried out in the same manner by determining the neighbouring characters and the connection character from a table. This is illustrated in FIG. 18.

After the characters have been determined for each coordinate that is occupied by a line, the operation of the line crossing algorithm is finished in step 1050.

Figure 19A:
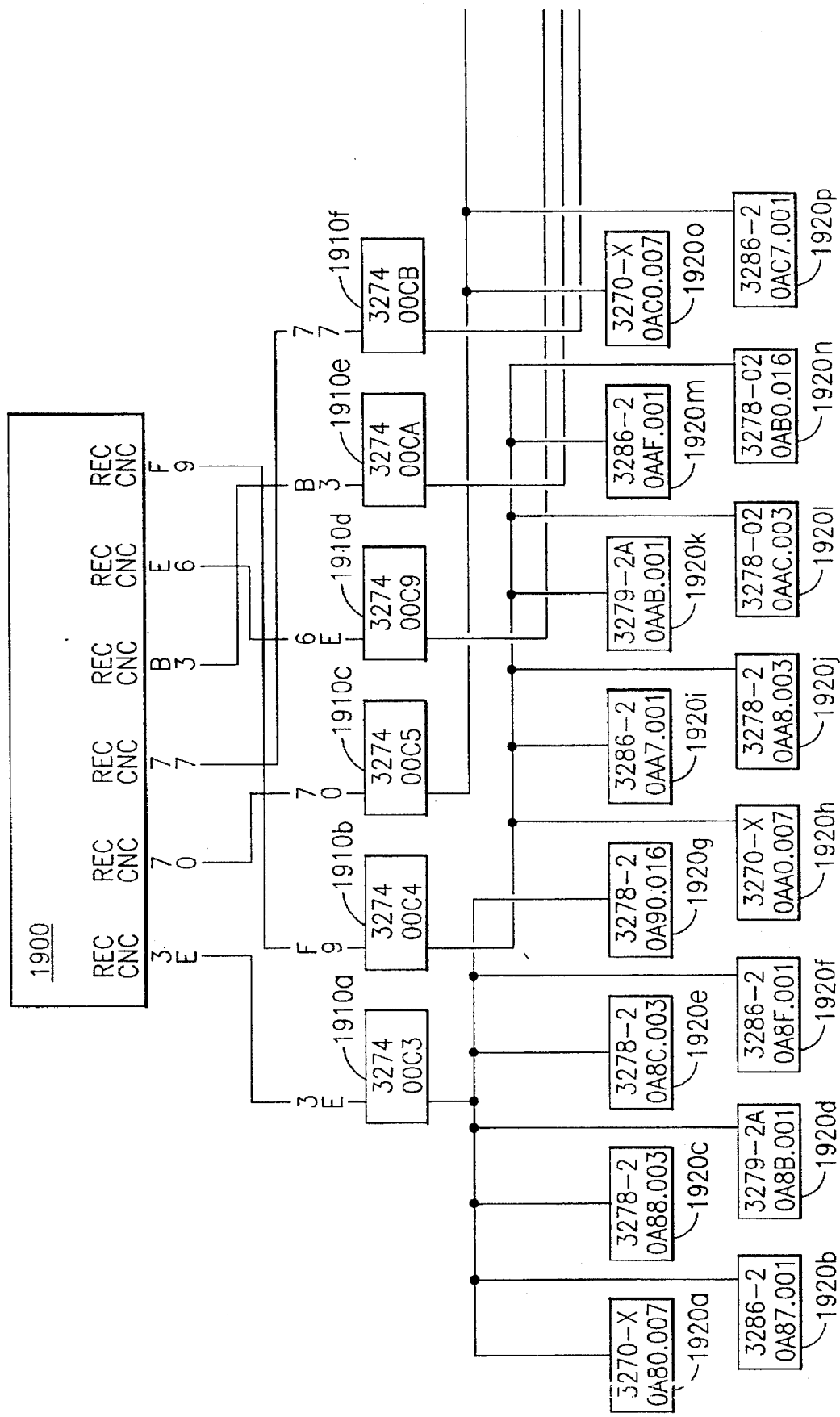
FIG. 19 shows another typical example of a configuration diagram illustrating other aspects of the invention.
Figure 19B:
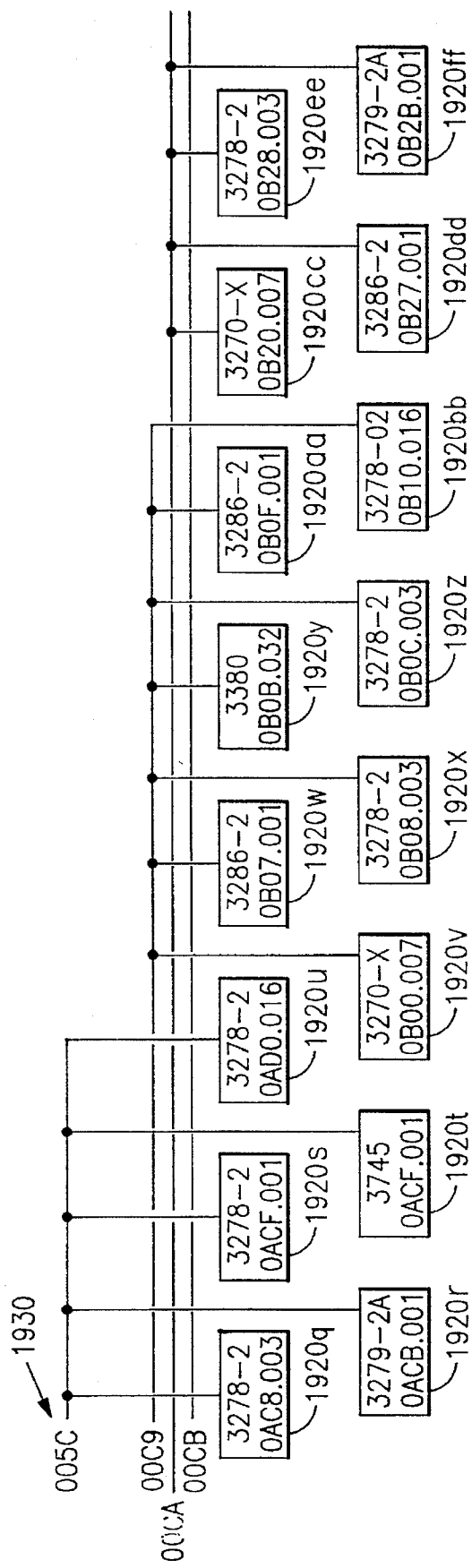

FIG. 19, which is constructed from FIGS. 19A and 19B, illustrates the further aspects of the invention which are produced by steps 360 of the flow diagram of FIG. 5. FIG. 19 shows an example of a generated configuration display which is too large for printing on a single sheet of paper. The figure illustrates one processor 1900 connected to five control units 1910a–f which are in turn connected to thirty-four devices 1920a–ff (only thirty-two are shown in FIGS. 19A and 19B). Within each of the blocks representing the processor 1900, control units 1910a–f or devices 1920a–ff is placed information about the model type and its address. For example, control unit 1910a is a 3274 unit and has the address 00C3, control unit 1910d is also a 3274 unit but as the address 00C9. Similarly, device 1920a is a 3270-type terminal with address 0A80. The number after the comma indicates the number of terminals with this address, i.e. 007. Device 920t is a 3745 tape unit at the address 0ACF, only one tape unit being present. The block at device 920y represents thirty-two 3380 DASDs at the address 0B0B. The information stored in the block is obtained from the information stored in the processing tables 50 which was copied from the IODF 65 in step 310.

FIG. 19B also illustrates the use of off-page connectors 1930 as mentioned above in connection with step 370 of the flow diagram of FIG. 5 for aiding in the understanding of configuration displays which extend over several pages. The off-page connectors 1930 are appended to the beginning of the lines connecting the control units 1910a–f to those devices 1920q–ff on a new page. The off-page connectors 1930 give the addresses of the control units 1910a–f to which the devices 1920q–ff on the page are connected.

Also illustrated on FIG. 19A are texts generated in step 360 of the flow diagram of FIG. 5 which are associated with the lines connected the control units 1910a–f with the processor 1900. These texts show the channel numbers of the processor 1900 to which the control units 1910a–f are connected. For example, control unit 1910c is connected to channel number 70 in the processor 900 and control unit 910e is connected to channel number B3 in the processor 900.

Figure 20A:
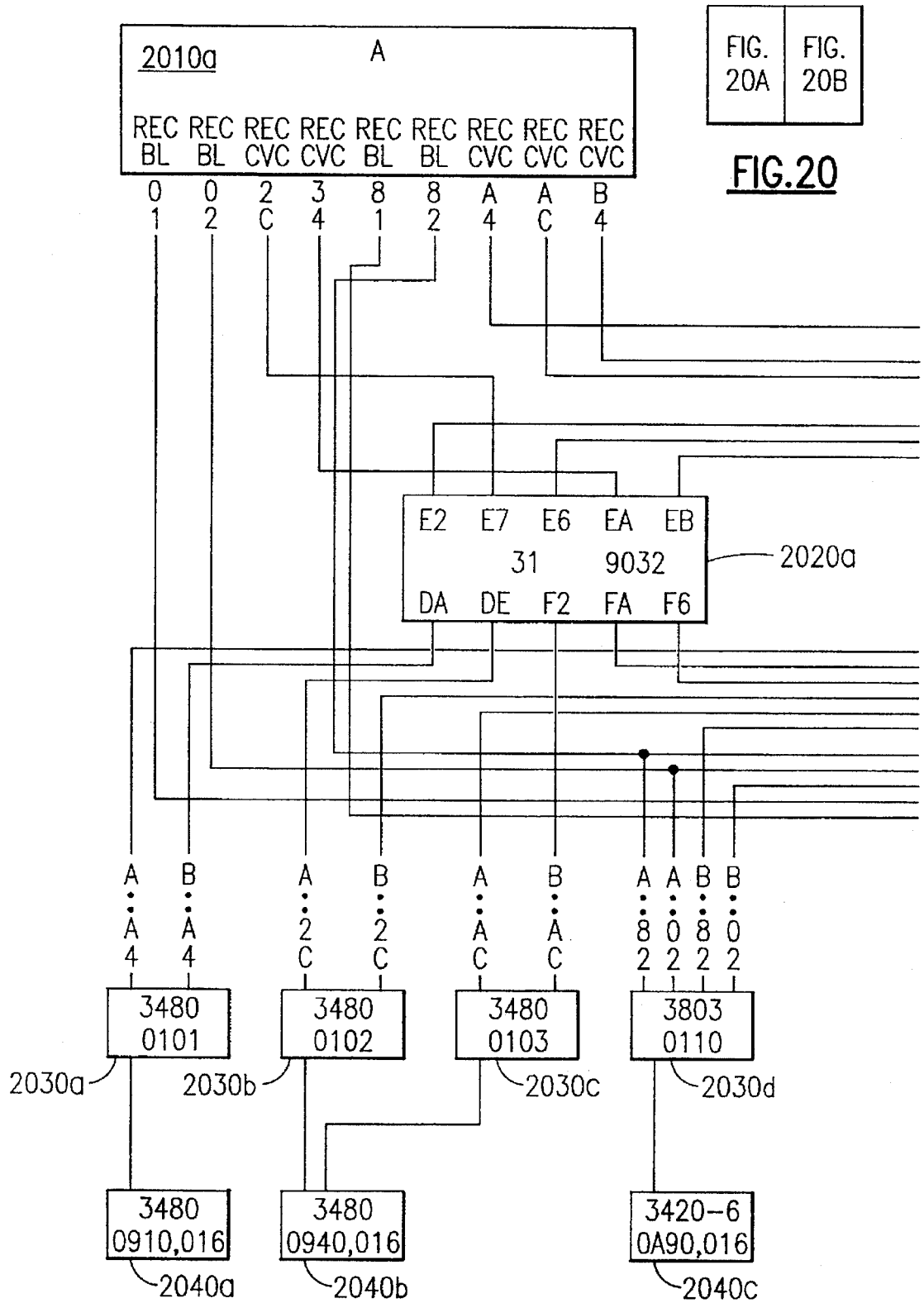
FIG. 20 shows a further typical example of a configuration diagram illustrating other aspects of the invention.
Figure 20B:
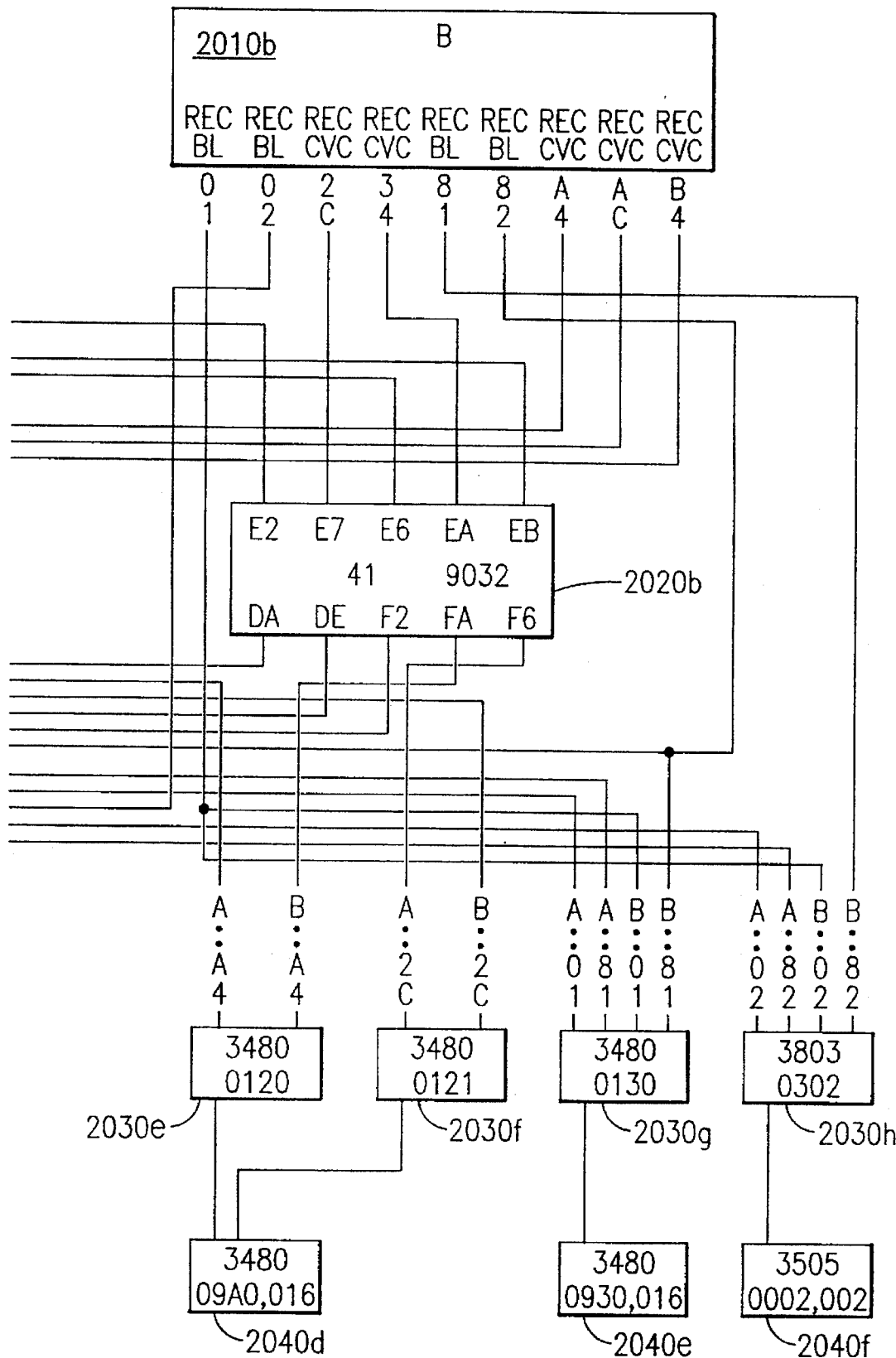

FIG. 20 shows another example of a configuration display. In addition to two processors 2010a, 2010b, eight control units 1030a–h and six devices 2040a–f, the display further shows two switches 2020a and 2020b. The switches illustrated here are ESCON control directors as shown by their module type 9032. In order to generate the configuration display of FIG. 20, it is necessary to modify the process used to generate the configuration display. The configuration display memory space 90 of FIGS. 6A–6D is logically divided into four blocks (rather than the three blocks described in connection with the data processing system 5). The graphical symbols representing the switches 2020a, 2020b are then placed in a portion between the topmost portion 610 and the middle portion 620. Apart from this slight modification, the process for drawing the connections between the graphical symbols on the diagram is unchanged.

FIG. 20 also shows a further embodiment of the invention. It will be noted that the processor 2010a is labelled A and processor 2010b is labelled B. Labels attached to the lines connecting the control units 2030a–h with the switches 2020a–b and/or processors 2010a–b are therefore not only labelled with the channel number of the processor 2010a–b but also with the letter designating the processor. The viewer of the configuration diagram of FIG. 10 is therefore able to see immediately, for example, that the 3480 control unit 2030c is connected to channel number AC of processor B and also channel number AC of processor A.

In all of the illustrated configuration diagrams, simple rectangular blocks are used as the graphical display symbols. It is clear, however, to one skilled in the art that different graphical symbols could be used for differing types of display objects.

What is claimed is:

1. In a data processing system comprising a central processor having an associated memory and one or more peripheral devices attached to said central processor, apparatus for generating a display of the hardware configuration of said system, comprising:

means for generating a configuration table in said memory of said central processor, said configuration table containing configuration data describing a current hardware configuration of said central processor, said configuration data defining logical connections between said one or more peripheral devices and said central processor;

means for creating a configuration display memory space in said memory of said central processor for constructing a display of said logical connections between said one or more peripheral devices and said central processor by using said configuration data describing said current hardware configuration of said central processor; and means for outputting the contents of said configuration display memory space to an output device to display the configuration of said system.

2. Apparatus as in claim 1 in which said system comprises a plurality of central processors, said apparatus comprising:

means for generating a first configuration table for defining logical connections between said plurality of central processors, said first configuration table being usable for constructing a display of said logical connections between said plurality of central processors within said configuration display memory space.

3. Apparatus as in claim 2 in which each of said plurality of central processors has one or more peripheral devices attached to it, said apparatus comprising:

means for generating a plurality of second configuration tables, each of which defines logical connections between one of said plurality of central processors and the one or more peripheral devices attached to it.

4. Apparatus as in claim 1 in which said system comprises a plurality of peripheral devices connected to said central processor, said configuration table defining logical connections between said plurality of peripheral devices and said central processor.

5. Apparatus as in claim 1 in which said system comprises a control unit connected between said central processor and said one or more peripheral devices, said configuration table defining logical connections between said control unit, said one or more peripheral devices and said central processor.

6. Apparatus as in claim 1 wherein said configuration table includes:

a list of logical connections between said central processor and said one or more peripheral devices;

a pointer to a list of central processors; and a pointer to a list of peripheral devices.

7. Apparatus as in claim 1 in which said output device is a display device.

8. Apparatus as in claim 1 in which said output device is a printer.

9. Apparatus as in claim 1 comprising said central processor.

10. Apparatus as in claim 9 comprising said one or more peripheral devices.

11. Apparatus as in claim 10 comprising a control unit connected between said central processor and said one or more peripheral devices.

12. Apparatus as in claim 9 comprising a plurality of said central processors.

13. A method for displaying the hardware configuration of a data processing system on an output device, said data processing system comprising a plurality of entities having a defined topology, said entities including a central processor having an associated memory, said method comprising the steps of:

defining displayable information;

creating a configuration display memory space in said memory of said central processor;

reading configuration data relating to logical connections between said entities from a configuration table stored in said memory of said central processor, said configuration table containing configuration data describing a current hardware configuration of said central processor;

determining said topology of said entities;

placing in said configuration display memory space entries to represent said entities;

extracting connection data between said entities from the read configuration data;

creating in said configuration display memory space connections between said entities using the extracted connection data; and outputting on said output device the configuration of said data processing system using said configuration display memory space.

14. The method of claim 13 wherein said plurality of entities comprises one or more groups of entities of similar type, said placing step comprising the step of:

placing all the members of the same group of entities of similar type in the same region of said configuration display memory space.

15. The method of claim 13 further comprising the step of:

optimizing the layout of said entities and connections within said configuration display memory space for receiving a concise displayable layout of the configuration.

16. The method of claim 13 wherein said creating step further comprises the steps of:

determining crossings of connections; and placing a particular symbol at the position of said crossings.

17. The method of claim 13 wherein said creating step further comprises the steps of:

determining coincidences of lines representing vertical and horizontal connections; and eliminating said coincidences.

18. The method of claim 13 wherein said memory comprises a virtual memory.

19. The method of claim 13 wherein said plurality of entities includes one or more peripheral devices attached to said central processor.

* * * * *